(12) United States Patent
Hsin

(10) Patent No.: US 7,046,496 B2
(45) Date of Patent: May 16, 2006

(54) ADAPTIVE GAIN ADJUSTMENT FOR ELECTROMAGNETIC DEVICES

(75) Inventor: Yi-Ping Hsin, Dublin, CA (US)

(73) Assignee: Nikon Corporation, Tokyo (JP)

( * ) Notice: Subject to any disclaimer, the term of this patent is extended or adjusted under 35 U.S.C. 154(b) by 401 days.

(21) Appl. No.: 10/430,598

(22) Filed: May 5, 2003

(65) Prior Publication Data

US 2004/0223283 A1    Nov. 11, 2004

(51) Int. Cl.
*H01H 47/00* (2006.01)

(52) U.S. Cl. ............................... 361/139

(58) Field of Classification Search ............... 361/139, 361/147, 146, 159; 700/28, 29, 30, 31
See application file for complete search history.

(56) References Cited

U.S. PATENT DOCUMENTS

| | | | | |
|---|---|---|---|---|
| 4,019,131 A * | 4/1977 | Yamada et al. | ............ | 324/229 |
| 5,065,093 A * | 11/1991 | Nauta et al. | ............ | 324/207.12 |
| 5,227,948 A | 7/1993 | Boon et al. | ............... | 361/144 |
| 5,243,491 A | 9/1993 | Van Eijk et al. | ............ | 361/144 |
| 6,069,417 A | 5/2000 | Yuan et al. | ................... | 310/12 |
| 6,130,517 A | 10/2000 | Yuan et al. | ................. | 318/640 |
| 6,472,777 B1 | 10/2002 | Teng et al. | ................... | 310/12 |
| 6,650,113 B1 * | 11/2003 | Sekiya | ....................... | 324/258 |
| 6,690,563 B1 * | 2/2004 | Ozawa et al. | ............... | 361/154 |
| 6,966,040 B1 * | 11/2005 | Ismailov | ....................... | 716/1 |
| 2002/0033230 A1 | 3/2002 | Hayashi et al. | ............. | 156/345 |

* cited by examiner

*Primary Examiner*—Stephen W. Jackson
*Assistant Examiner*—Zeev Kitov
(74) *Attorney, Agent, or Firm*—Finnegan, Henderson, Farabow, Garrett & Dunner LLP

(57) ABSTRACT

A control system for the adjustment and calibration of electromagnetic devices, such as E-I core electromagnetic devices, using adaptive gain adjustment. A controller is provided with an input current and an output force and provides an output signal indicative of a force gain estimate, wherein the force gain estimate is the ratio of the output force to the input current.

21 Claims, 10 Drawing Sheets

ADAPTIVE GAIN ADJUSTMENT FOR ELECTROMAGNETIC DEVICES

BACKGROUND OF THE INVENTION

1. Field of the Invention

The present invention relates generally to control systems, and more particularly, the present invention relates to adjustment and calibration of electromagnetic devices.

2. Description of Related Art

Electromagnetic devices are well known. One example is an E-I core actuator, which is a type of electromagnetic linear motor so named because of its two main components. The first component is the E-core, which is a three-barrel structure having a shape that resembles the letter "E" with an insulated electric coil wire wound around the center bar and a source of current supplying current to the coil. Current running through the coil creates an electromagnetic field which attracts an associated I shaped core. Thus, an electromagnetic force is exerted across the width of a gap between the E-core and the I-core. When a constant current is supplied to the coil, the force of the electromagnetic field may change as the gap distance changes. This change in force is often referred to as the output force gain of the E-I core system.

E-I core electromagnetic devices may be used to precisely adjust the position of an object. Unlike, for instance, a bi-directional voice coil motor which also provides precision positioning, E-I core electromagnetic devices use substantially less electric current and therefore less energy in the form of waste heat. Another benefit of E-I core electromagnetic devices is the reduction of vibration during precision motion. For instance, precision motion is frequently needed in machining, lithography, and other strict tolerance manufacturing applications e.g., in stepper and scanner machines used in the semiconductor industry. Typically, the goal is to provide precise adjustment of, for instance, a sampler or work piece stage in three dimensions.

In the prior art, calibration and adjustment is often done through a mechanical adjustment, which has been found to be time consuming and imprecise, especially due to problems of drift attributable to thermal or other effects. This both degrades performance and reduces system throughput, since time is required for the actual calibration. An improved calibration method would be very desirable for such systems.

When using an E-I core electromagnetic device, the output force gain may be used to calibrate the device for precision adjustments, such as for positioning components of a precision machine. Precisely positioning machine components is difficult because the output force gain varies due to effects such as part-to-part variance, geometric mounting inaccuracy, and a dynamically changing gap distance during operation of E-I core electromagnetic device. Using a gap distance measurement, E-I core commutation equations may be used to model the output force gain. These models require burdensome hand tuning for each E-I core electromagnetic device. Further, even with a model, it is difficult to obtain precise measurements when dealing with large ranges of gap distance. Moreover, equations used in models, such as force gain model equations, become ineffective when gap distance information is unavailable or the force gain changes due to unmodeled factors.

Thus, there is a need for an improved method of modeling output force gain in electromagnetic devices to create precise measurements and adjustments. Further, there is a need for an improved method of calibrating the output force gain for E-I core electromagnetic devices.

SUMMARY OF THE INVENTION

Systems and methods consistent with embodiments of the present invention provide for a controller for an electromagnetic device. In accordance with one embodiment of the invention, a controller is provided with a first input port adapted so as to receive data indicative of an input current; a second input port adapted so as to receive data indicative of an output force; and an output port adapted so as to provide an output signal indicative of a force gain estimate, wherein the force gain estimate is the ratio of the output force to the input current.

In accordance with another embodiment of the invention, a controller electrically coupled to an E-I core electromagnetic device is provided with a first input port adapted so as to receive data indicative of an input current; a second input port adapted so as to receive data indicative of an output force; a processor for generating a force gain estimate, wherein the force gain estimate is the ratio of the output force to the input current; and an output port adapted so as to provide an output signal indicative of an adjusted current, wherein the current is adjusted based on the ratio of a constant force gain and the force gain estimate.

In accordance with another embodiment of the invention, an E-I core electromagnetic device comprising, a controller electrically coupled to the E-I core electromagnetic device to control the electric current to the device, wherein the controller generates an adjustment value from the ratio of a constant force gain to a force gain estimate, wherein the force gain estimate is ratio of an output force and an input current.

In accordance with another embodiment of the invention, an apparatus is provided with a first assembly including an E-core of an electromagnetic device; a second assembly including an I-core of the electromagnetic device which cooperates with the E-core and is located adjacent to the E-core; a third assembly including a force sensor attached to E-core to supply the output force signal; and a controller coupled to the electromagnetic device to control a current to the E-core, wherein the controller controls the current based on the ratio of a constant force gain to the force gain estimate.

It is to be understood that both the foregoing general description and the following detailed description are exemplary and explanatory only and are not restrictive of the embodiments of the present invention, as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Reference will now be made in detail to the presently preferred embodiments of the present invention, examples of which are illustrated in the accompanying drawings.

In one embodiment of the invention, adaptive gain adjustment ("AGA") for an E-I core electromagnetic device uses a force gain estimate to adjust controller output in real time. The AGA is a step in the control system supplying calibration and adjustment ability to the system without hand tuning. AGA corrects for changes in gap distance measurements, making complicated models unnecessary, and providing E-I core electromagnetic devices with precision control under different conditions, such as gap distance, tilt angle, or part-to-part variance. AGA also provides a tool to calibrate the output force gain of an E-I core electromagnetic device.

Embodiments of the present invention may be implemented in connection with various types of E-I core electromagnetic devices used, for example, in precision force and motion control applications. The E-I core electromagnetic device is operated by exerting an electromagnetic force across a gap, and may be a non-contact force or position control device. By way of a non-limiting example, an exemplary implementation will be described with reference to Chemical Mechanical Polish (CMP). As can be appreciated by those skilled in the art, embodiments of the invention can be implemented for other types of E-I core electromagnetic devices, such as for actuators in scanning lithography systems.

Figure 1:
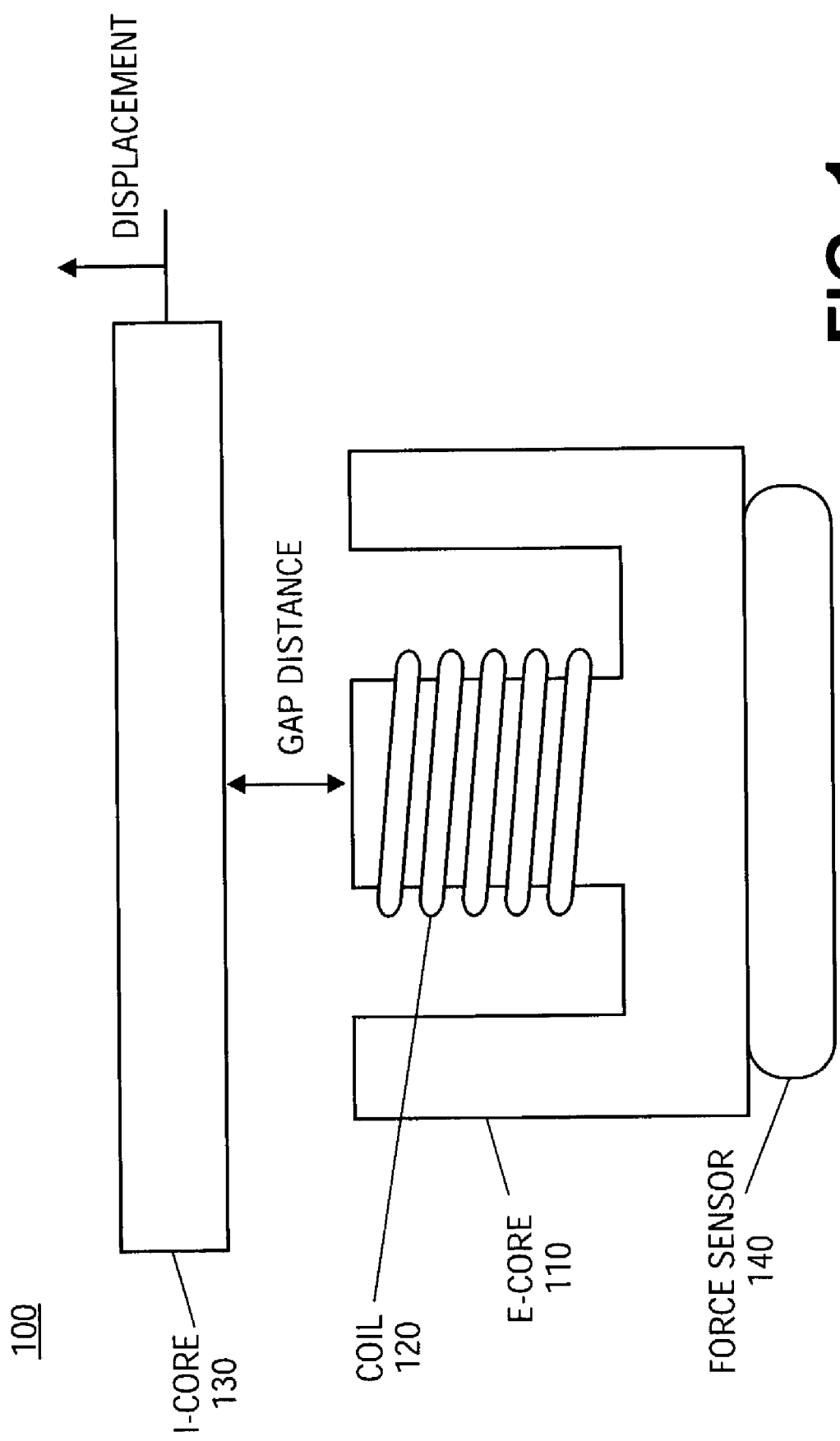
FIG. 1 is an illustration of an E-I Core electromagnetic device mounted with a force sensor consistent with an embodiment of the invention.

FIG. 1 is an illustration of an exemplary E-I core electromagnetic device that provides non-contact force or position control. The main components of an exemplary E-I core electromagnetic device setup include a fixed E-core 110, a coil 120, a movable I-core 130, and a force sensor 140.

Fixed E-core 110 may be any type of core material for use with a coil. In one embodiment, E-core 110 may be a C-core. In another embodiment, E-core 110 may be a 5-pronged core. Coil 120 may be any coil that creates a circulating magnetic field. I-core 130 may be any type of metal or other material capable of responding to a force filed generated by Coil 120. In one embodiment, I-core 130 may be connected to a structure.

Force sensor 140 may be used for control purpose. Examples of force sensor 140 include standard contact sensors, such as a load cell or a strain gauge, which are standard force sensors known to those in the art.

Each E-I core electromagnetic device has a force constant (c) associated with the E-I core actuator design. An input current (I) runs through coil 120. The current creates an output force (F) between fixed E-core 110 and moveable I-core 130. In FIG. 1 the gap distance is a previously measured value, x. In some embodiments the gap distance measurement is available from a sensor. f(x) is the gap function, which models the geometry of the E-I core design and setup. For an ideal flat surface E-core and I-core in parallel, the gap function can be as simple as $f(x)=x^2$. Other more complicated gap functions may be expressed for different designs and mounting geometries.

With the input current, I, force constant, c, and gap distance, x, between E-core and I-core, the output force F is usually estimated by the commutation equation:

$$F = c \cdot \frac{I^2}{f(x)} \tag{1}$$

In practice, however, the commutation equation is difficult to estimate for ranges of gap distance due to movement of the I-core. Further, a commutation equation model needs tuning and verification.

The output force gain is a function of the gap distance, and may be represented by the function G(x). At a discrete time-step, k, the gap distance is represented by the function x(k). The output force gain is then G(x(k)), and can be represented by:

$$G(x(k)) = \frac{c}{f(x(k))} \tag{2}$$

At the k-th time-step, the force output, F(k), with an input current, I(k), can be rewritten in discrete-time domain as:

$$F(k) = G(x(k)) \cdot I^2(k) \tag{3}$$

Figure 2:
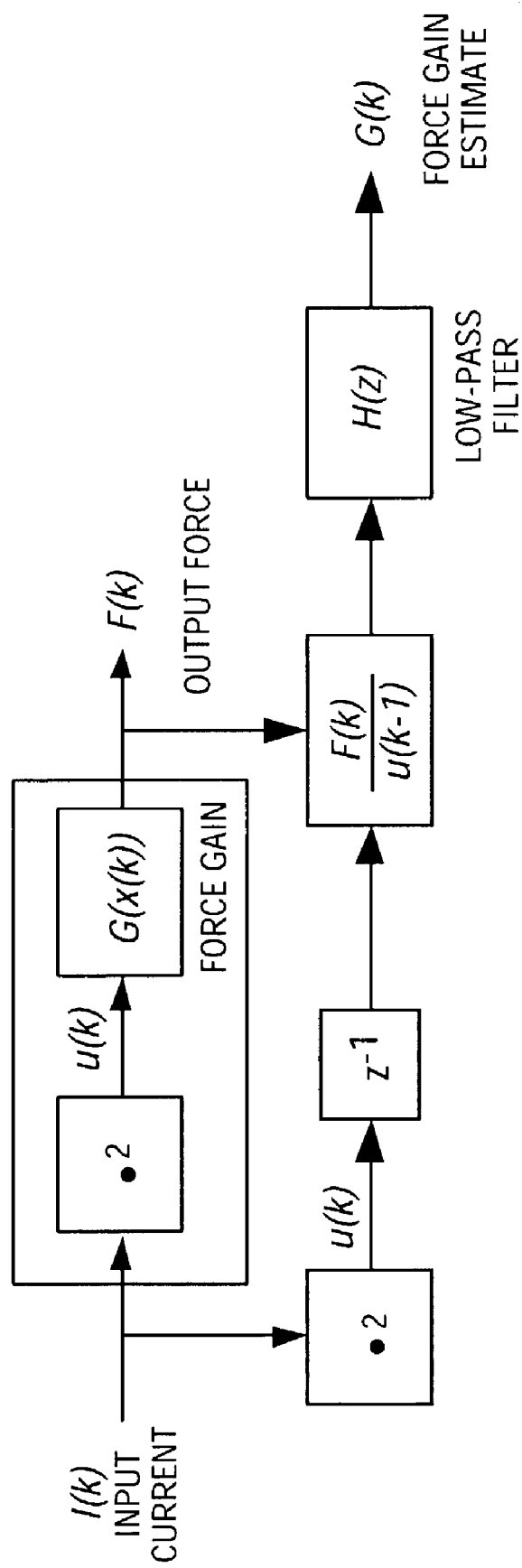
FIG. 2 is a block diagram of the real-time E-I core force gain estimate scheme consistent with an embodiment of the invention.

FIG. 2 illustrates how the output force gain, G(x(k)), can be used to determine a force gain estimate, $\hat{G}(k)$. The force gain estimate uses the input current, I(k), to generate the input command, u(k), which can be calculated by:

$$u(k) = I^2(k) \tag{2}$$

Given the input current, I(k), and an output force, F(k), the force gain, G(x(k)), can be computed directly by:

$$G(x(k)) = \frac{F(k)}{u(k)} \tag{3}$$

Because the digital signal I/O loop inherits one time-step delay, the force gain estimate, $\hat{G}(k)$, at the k-th time-step can be obtained by:

$$\hat{G}(k) = \left(\frac{F(k)}{u(k-1)}\right) * h(k) \tag{4}$$

where asterisk mark (*) means discrete-time convolution sum, and h(k) represents a low-pass filter added in the signal path to reduce the signal noise.

The force gain estimate relieves the commutation equations from the need for gap distance measurements. This force gain estimate can then be incorporated as an adjustment value into AGA control step or can stand alone as a tool for calibrating for each E-I core electromagnetic device. It is to be understood that this process is typically carried out by a microprocessor (or microcontroller), which is properly programmed and typically resident in such a system for purposes of controlling E-I electromagnetic devices. This microprocessor may be part of a conventional feedback loop controlling the device. Of course, one does not require a microprocessor or microcontroller to carry out the functions, but this process may be performed, for instance, by hardwired circuitry or other control circuitry instead. A computer rather than a microprocessor or microcontroller could also perform the functions.

Embodiments of the present invention may be implemented in connection with various types of E-I core electromagnetic devices in various applications. By way of a non-limiting example, an exemplary implementation will be described with reference to a Chemical Mechanical Polish ("CMP") application. As can be appreciated by those skilled in the art, embodiments of the invention can be implemented using other types of electromagnetic devices or in other applications where a non-contact force or position control device is appropriate, such as actuators in scanning lithography systems.

Figure 3:
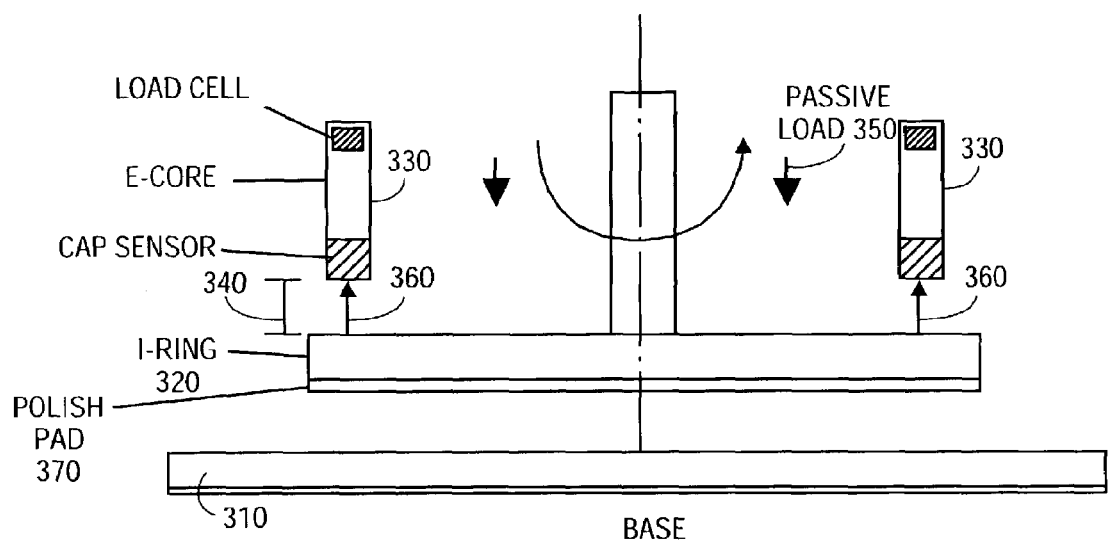
FIG. 3 is an illustration of a CMP force-control prototype consistent with an embodiment of the invention.

FIG. 3. illustrates a CMP force-control prototype. The prototype includes a base 310, a circular I-core ring 320, and E-core 330. CMP is applied to base 310 with a passive force load 350 using circular I-core ring 320. In one embodiment, passive force load 350 may be a passive inaccurate air-pressure force load. During operation, circular I-core ring 320 is attached with a polish pad 370, which rotates above base 310. E-core 330 is mounted above circular I-core ring. This E-I core device is used to control the passive force load 350 applied to rotating I-core ring 320. Due to the imperfect surface and the vibration of I-core ring 320, rotating I-core ring changes the gap distance 340 dynamically, directly affecting the output force gain. E-core 330 can be used to precisely control the polishing force on rotating I-core ring 320, to insure a smooth and even polish. Varying the current provided to the coil of E-core 330, creating a counter force 360 may precisely control the applied polishing force. The adaptive gain adjustment adjusts the current in order to insure a consistent applied force, even with variations in gap distance.

Figure 4:
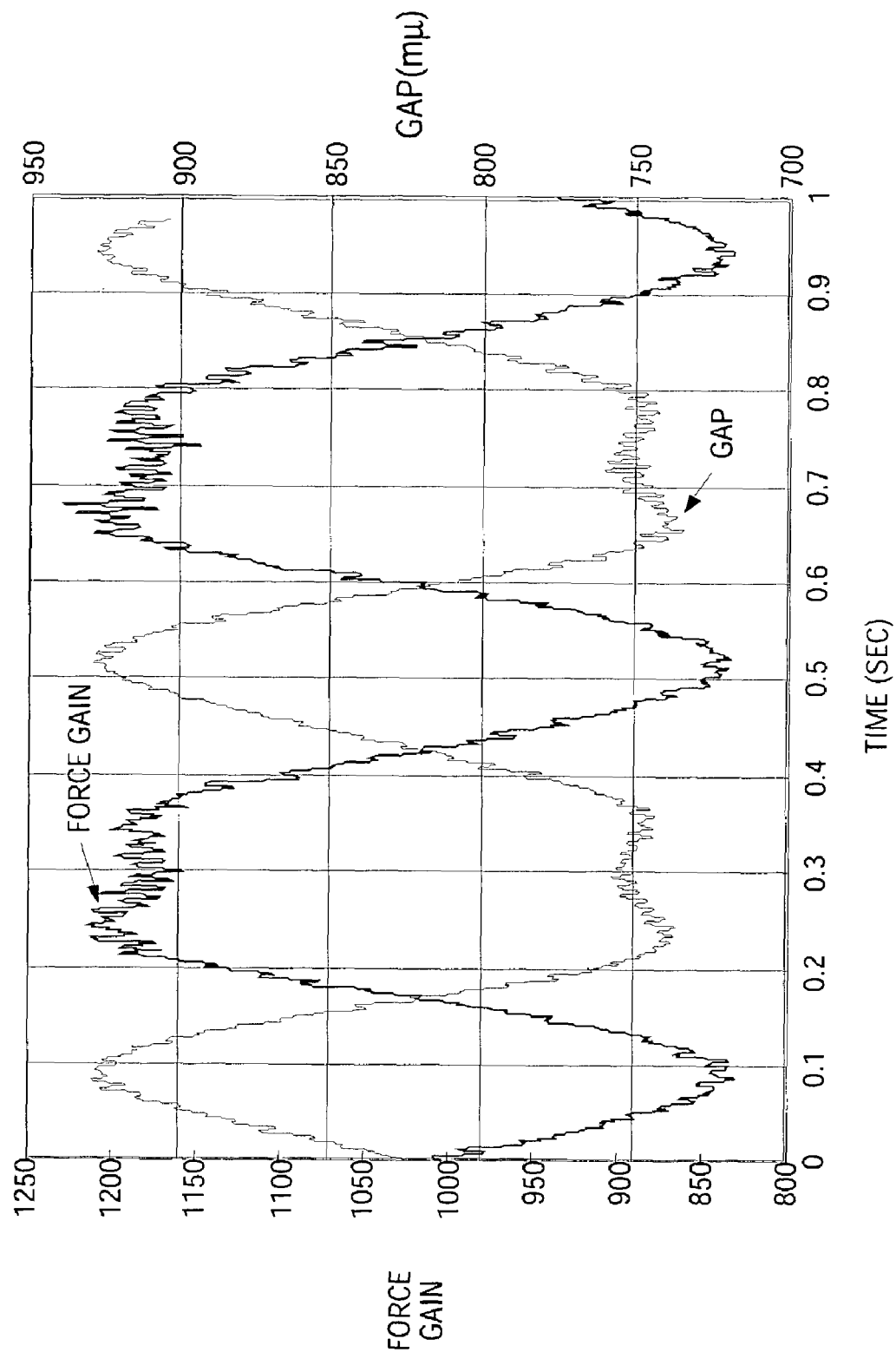
FIG. 4 is a time history graph of gap distance and force gain estimate, illustrating a problem to be solved.

FIG. 4 is a time history plot of gap distance and force gain estimate during operation of the E-I core in the CMP prototype. This graph illustrates the problem of a widely varying force generated during the operation of an E-I core electromagnetic device. That kind of variation is a problem in designs needing uniform performance. In this embodiment, the rotating speed of I-core ring 320 is 140 RPM, and constant 2-amp current is supplied to E-core 330. The graph tracks the force gain estimate, as the gap distance varies in between 720 µm and 930 µm. The force gain estimate changes dynamically in between 830 µm to 1200 µm. This type of gain variation affects output performance, and in traditional systems is a challenge to the designs for uniform and optimal performance.

Figure 5:
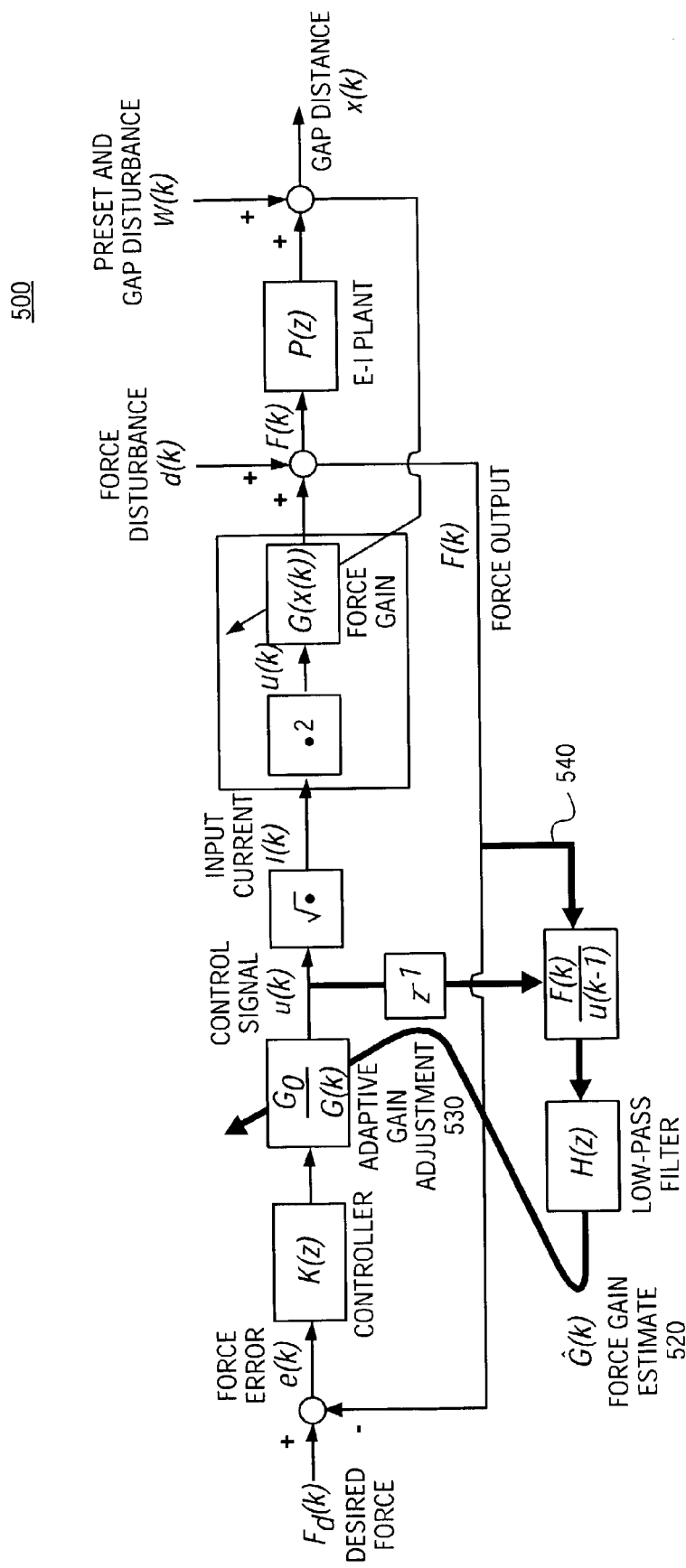
FIG. 5 is a block diagram of a CMP force-control loop with an adaptive gain adjustment servomechanism consistent with an embodiment of the invention.

FIG. 5 illustrates how AGA may be used in a CMP force control loop. This embodiment includes utilizing a real-time force gain estimate 520 and an adaptive gain adjustment block 530 in the force control loop. The E-I core electromagnetic device is calibrating at the preset gap distance by measuring the constant force gain, $G_0$. Based on the constant force gain, $G_0$, a feedback controller, $K(z)$, is then designed and optimized. The feedback controller is electrically coupled to the E-I core. The coupling may be direct, or there may be various components between the E-I core and the controller. During operation, due to the effects of output force, $F(k)$, and gap disturbance, $w(k)$, the gap distance, $x(k)$, will change dynamically, causing the generation of an output force gain, $G(x(k))$. Without adjustment, the force gain variance will degrade system output performance.

The experimental setup for the constant force gain, $G_0$, is obtained at a 800 µm gap distance. When the gap distance is larger than 800 µm, the actual force gain, $G(x(k))$, can be expected lower than $G_0$, and vice versa.

In one embodiment, an adaptive gain adjustment block 530 is applied to the feedback control system to trace and adjust the controller gain in real-time to compensate for force gain variance. The real-time force gain estimate path 540 generates the force gain estimate, $\hat{G}(k)$, to approximate actual force gain, $G(x(k))$, and sends the force gain estimate out to the adaptive gain adjustment control block.

At the adaptive gain adjustment block, the controller gain is estimated as the ratio between the constant force gain, $G_0$, and the force gain estimate, $\hat{G}(k)$. In one embodiment, the gain adjustment value may be bounded in a reasonable range for system stability. The force gain estimate, $\hat{G}(k)$, will tend to cancel out the actual force gain, $G(x(k))$, to let the system behave as time-invariant with the constant force gain of $G_0$, thus preserving output performance during operation.

In one embodiment, an adaptive gain adjustment block 530 may be part of the controller. Adaptive gain adjustment block 530 may be implemented in circuitry, in firmware, or in a microprocessor (or microcontroller) that is appropriately programmed.

Figure 6:
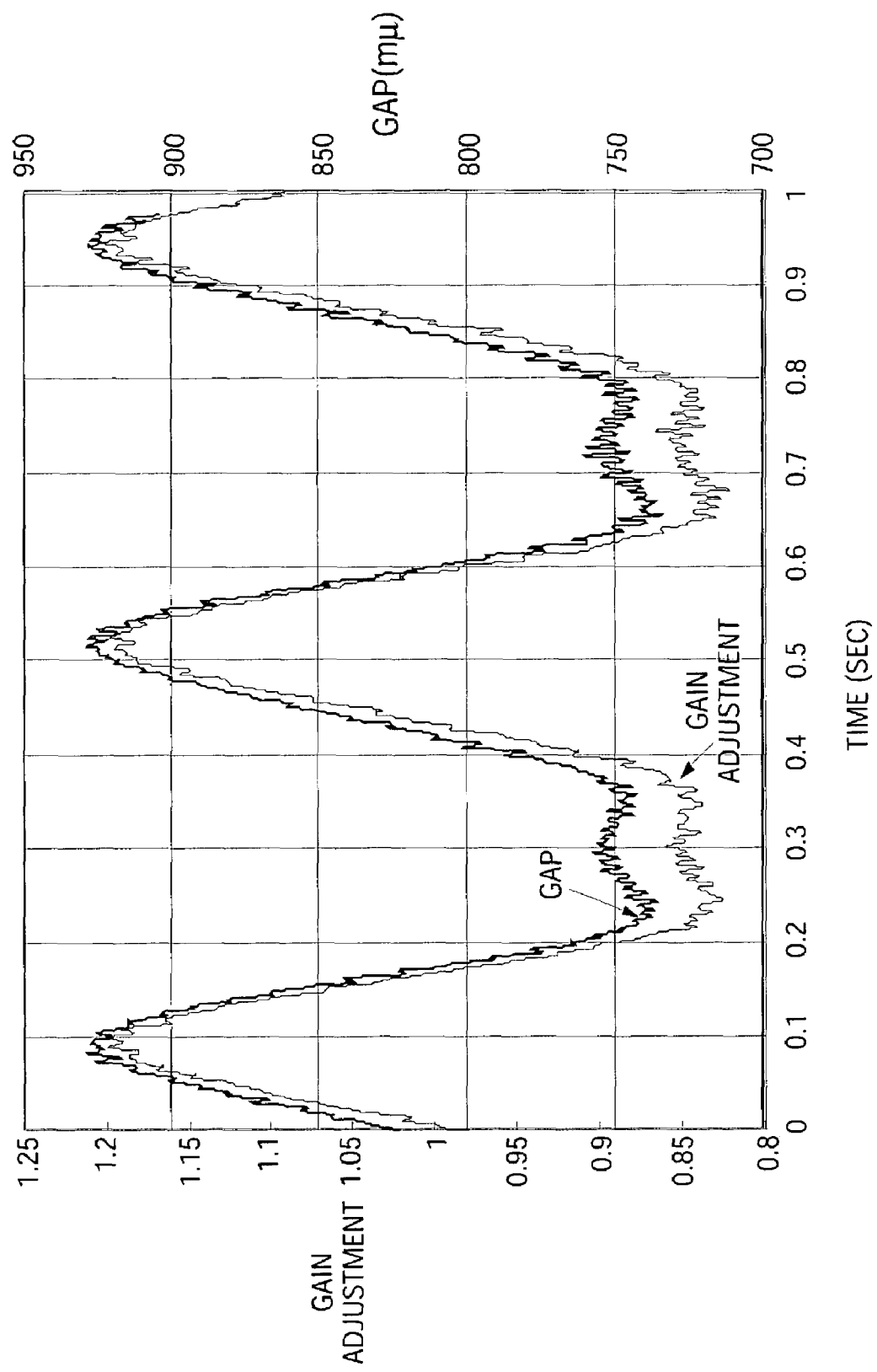
FIG. 6 is a time history graph of gain adjustment value and gap distance consistent with an embodiment of the invention.

FIG. 6 illustrates graphs of experimental results showing the time history of gain adjustment and gap distance during operation. The gain adjustment value is the ratio of the constant force gain value to the force gain estimate. The graph shows how the gain adjustment value fluctuates in between 0.8 mm and 1.2 mm consistent with the gap distance change.

In another embodiment, the force gain estimate may be used for automatic calibration. Traditionally, a gap distance measurement is usually needed to determine the constant force gain value. Here, a constant force gain value may be estimated using the force gain estimate. For a system in which gap distance is not known, constant force gain can be calculated by running the control loop once. In one run through, the control loop, the force gain estimate can be determined. This force gain estimate value is an estimate of the constant force gain value.

Figure 7:
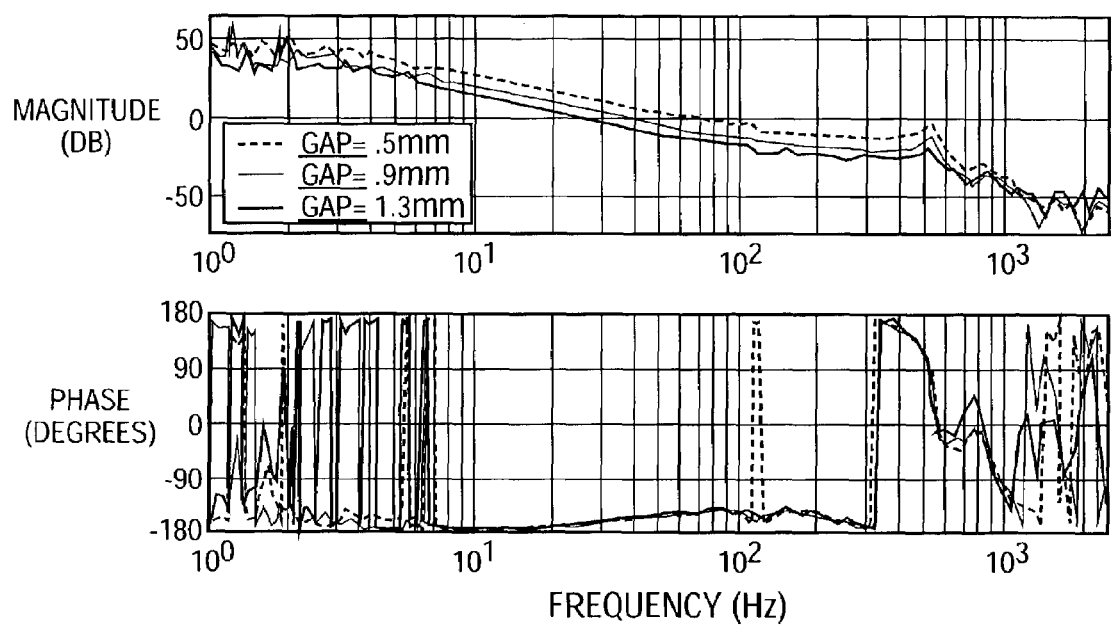
FIG. 7 is a graph of open-loop frequency response at three gap distances without adaptive gain adjustment ("AGA") consistent with an embodiment of the invention.
Figure 8:
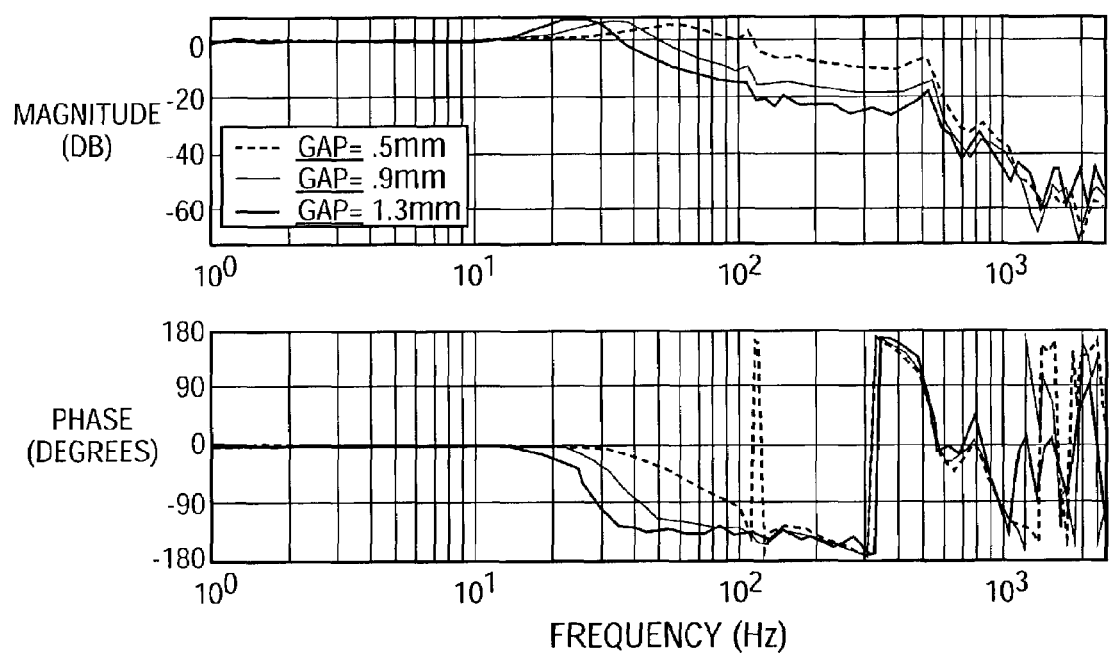
FIG. 8 is a graph of closed-loop frequency response at three gap distances without AGA consistent with an embodiment of the invention.
Figure 9:
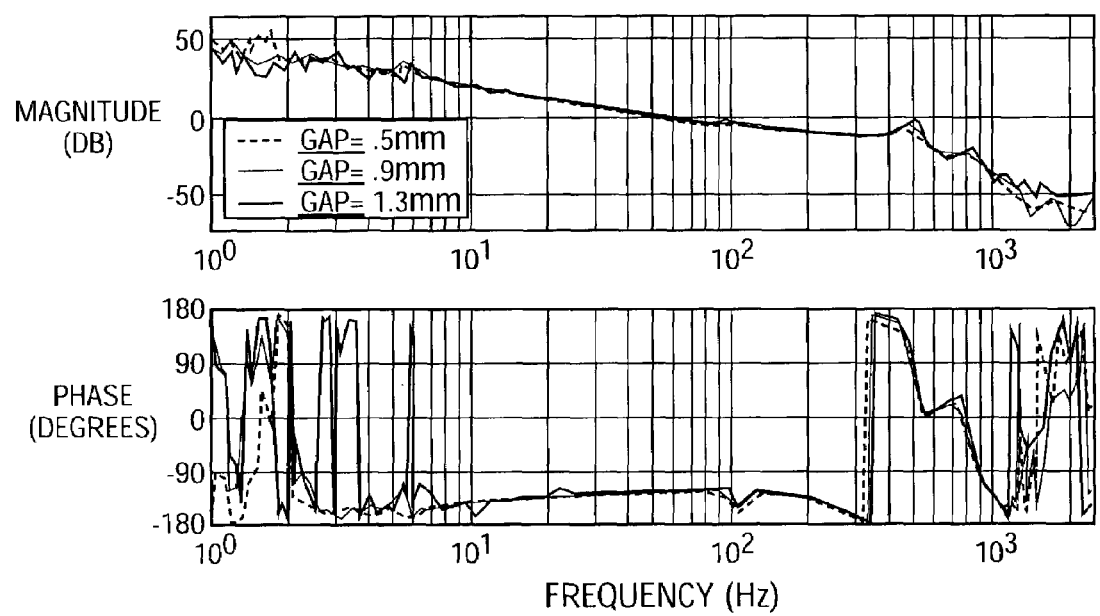
FIG. 9 is a graph of open-loop frequency response at three gap distances with AGA consistent with an embodiment of the invention.
Figure 10:
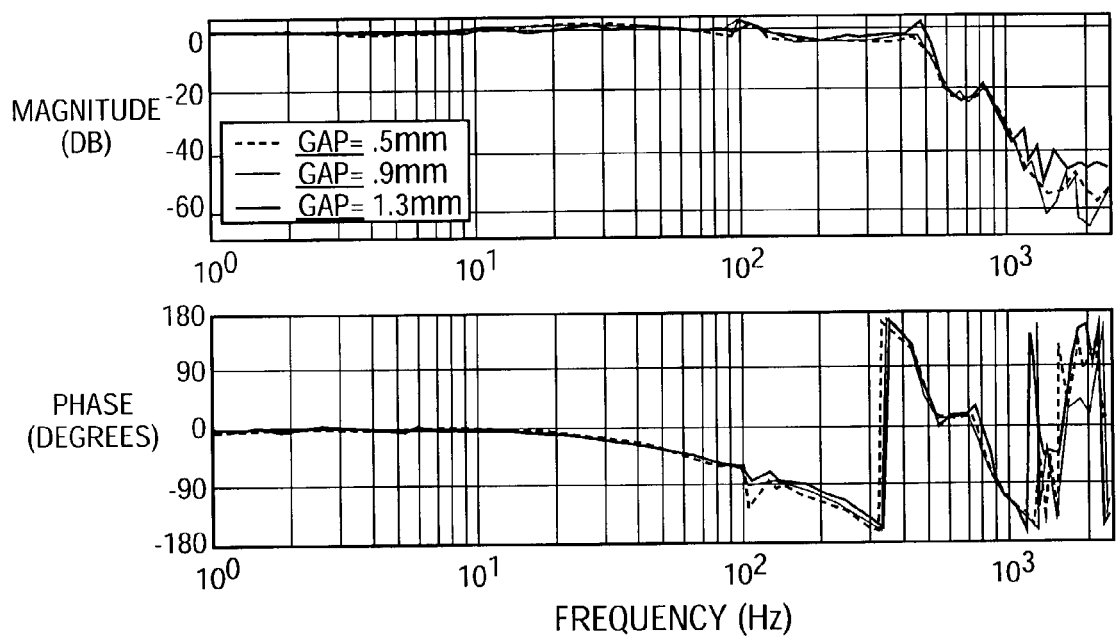
FIG. 10 is a graph of closed-loop frequency response at three gap distances with AGA consistent with an embodiment of the invention.

The following example will demonstrate results from the use of the AGA servomechanism. FIG. 7 is an open-loop response of the CMP force-control system having the same controller $K(z)$ design with three different preset gap distances, 0.5 mm, 0.9 mm, and 1.3 mm. This graph shows open-loop gain shifting attributable to the force gain change. FIG. 8 is the corresponding closed-loop response. It also shows that the bandwidth and performance vary significantly depending on the gap distance change. In this example, individual controller tuning is necessary. With the introduction of AGA, FIG. 9 shows the open-loop response with no gain-shifting phenomenon at three different gap distances. The corresponding closed-loop response shown in FIG. 10 also indicates the uniform bandwidth and performance regardless of the varying gap distances, without individual controller tuning.

While embodiments or features of the invention have been described as a functional block, one skilled in the art will appreciate that these aspects can also be implemented in the controller or through instructions stored in memory or stored on or read from other types of computer-readable media, or in circuitry.

Furthermore, the above-noted features and embodiments of the present invention may be implemented in various environments. Such environments and related applications may be specially constructed for performing the various processes and operations of embodiments of the invention or they may include a general purpose platforms selectively activated or reconfigured to provide the necessary functionality. The exemplary processes disclosed herein are not inherently related to any particular computer or other apparatus, and aspects of these processes may be implemented by a suitable combination of parts. For example, various general purpose machines may be used with programs written in accordance with teachings of the invention, or it may be more convenient to construct a specialized apparatus or system to perform the required methods and techniques.

Other embodiments of the invention will be apparent to those skilled in the art from consideration of the specification and practice of the exemplary embodiments disclosed herein. Therefore, it is intended that the specification and examples be considered as exemplary only, with a true scope and spirit of the invention being indicated by the scope of the following claims and their equivalents.

What is claimed is:

1. A controller for an electromagnetic actuator comprising:
    a first input port adapted so as to receive data indicative of an input current to an electromagnetic actuator;
    a second input port adapted so as to receive data indicative of an output force of the electromagnetic actuator; and
    an output port adapted so as to provide an output signal indicative of a force gain estimate, wherein the force gain estimate is a ratio of the output force to the input current;
    wherein the force gain estimate is a calibration estimate of constant force gain for the electromagnetic actuator.

2. The controller of claim 1, wherein the electromagnetic actuator is an E-I core electromagnetic actuator.

3. The controller of claim 1, further comprising a low pass filter to process the force gain estimate.

4. The controller of claim 2, further comprising a low pass filter to process the force gain estimate.

5. An E-I core electromagnetic system comprising:
    a controller electrically coupled to the E-I core electromagnetic actuator to control the electric current to the actuator, wherein the controller generates an adjustment value from a ratio of a constant force gain to a force gain estimate, wherein the force gain estimate is a ratio of an output force and an input current.

6. The system of claim 5, wherein the force gain estimate is further processed with a low pass filter.

7. An apparatus comprising:
    a first assembly including an E-core of an electromagnetic actuator;
    a second assembly including an I-core of the electromagnetic actuator; that cooperates with the E-core and is located adjacent to the E-core;
    a third assembly including a force sensor attached to at least one of the E-core or I-core to supply the output force signal; and
    a controller coupled to the electromagnetic actuator; to control a current to the E-core, wherein the controller controls the current based on a ratio of a constant force gain to the force gain estimate.

8. The apparatus of claim 7, wherein the force gain estimate is based on a ratio of an input current and a force output.

9. A method for adaptive gain adjustment for an electromagnetic actuator, comprising:
    generating an adjustment value through the ratio of a force gain to a force gain estimate, wherein the force gain estimate is a ratio of an output force and an input current; and
    applying an adjustment value to the current.

10. A controller for an electromagnetic actuator; comprising:
    means for receiving data indicative of an input current to the electromagnetic actuator;
    means for receiving data indicative of an output force of the electromagnetic actuator; and
    means for providing an output signal indicative of a force gain estimate, wherein the force gain estimate is a ratio of the output force to the input current;
    wherein the force gain estimate is a calibration estimate of constant force gain for the E-I core electromagnetic actuator.

11. A system comprising:
    an electromagnetic actuator; and
    a controller having:
        means for receiving data indicative of an input current to the electromagnetic actuator;
        means for receiving data indicative of an output force of the electromagnetic actuator; and
        means for generating a force gain estimate, wherein the force gain estimate is a ratio of the output force to the input current; and
        means for providing an output signal for adjusting the current to the electromagnetic actuator; wherein the current is adjusted based on a ratio of a constant force gain and the force gain estimate.

12. The system of claim 11, further comprising a low pass filter to process the force gain estimate.

13. The controller of claim 1, further comprising a processor for generating the force gain estimate.

14. The controller of claim 13, wherein the electromagnetic actuator; is an E-I core electromagnetic actuator.

15. The system of claim 5, wherein the force gain estimate is generated by a processor.

16. The system of claim 6, wherein the force gain estimate is generated by a processor.

17. The method of claim 9, further comprising processing the force gain estimate with a low pass filter.

18. The method of claim 9, wherein the adjustment value to the current is based on the force gain estimate.

19. The method of claim 17, wherein the adjustment value to the current is based on the force gain estimate.

20. The method of claim 9, wherein the force gain estimate is a calibration estimate of constant force gain for an electromagnetic actuator.

21. The method of claim 17, wherein the force gain estimate is a calibration estimate of constant force gain for an electromagnetic actuator.

* * * * *